United States Patent [19]
Sakaki et al.

[11] Patent Number: 5,965,329
[45] Date of Patent: Oct. 12, 1999

[54] METHOD OF MANUFACTURING A DEVELOPING AGENT BEARING MEMBER

[75] Inventors: Takashi Sakaki, Tokyo; Kazushige Nishiyama, Numazu, both of Japan

[73] Assignee: Canon Kabushiki Kaisha, Tokyo, Japan

[21] Appl. No.: 08/904,466

[22] Filed: Aug. 1, 1997

[30] Foreign Application Priority Data

Aug. 5, 1996 [JP] Japan ................................. 8-205781
Oct. 4, 1996 [JP] Japan ................................. 8-281555

[51] Int. Cl.⁶ ..................................................... G03F 7/00
[52] U.S. Cl. ........................... 430/320; 430/324; 430/325; 430/397
[58] Field of Search .......................... 430/320, 315, 430/396, 397, 324, 325

[56] References Cited

U.S. PATENT DOCUMENTS

| | | | |
|---|---|---|---|
| 4,092,165 | 5/1978 | Andrus et al. | 430/320 |
| 5,147,763 | 9/1992 | Kamitakahara | 430/320 |
| 5,268,259 | 12/1993 | Sypula | 430/311 |

FOREIGN PATENT DOCUMENTS

| | | |
|---|---|---|
| 4-158384 | 6/1992 | Japan . |
| 4-212183 | 8/1992 | Japan . |

*Primary Examiner*—John A. McPherson
*Attorney, Agent, or Firm*—Fitzpatrick, Cella, Harper & Scinto

[57] ABSTRACT

A developing agent bearing member is manufactured such that a base is prepared, and a photosensitive layer is formed on the base. Then, the photosensitive resist layer is exposed with a pattern, and an uneven portion is formed on a surface of the developing agent bearing member by etching the pattern-exposed photosensitive resist layer.

11 Claims, 7 Drawing Sheets

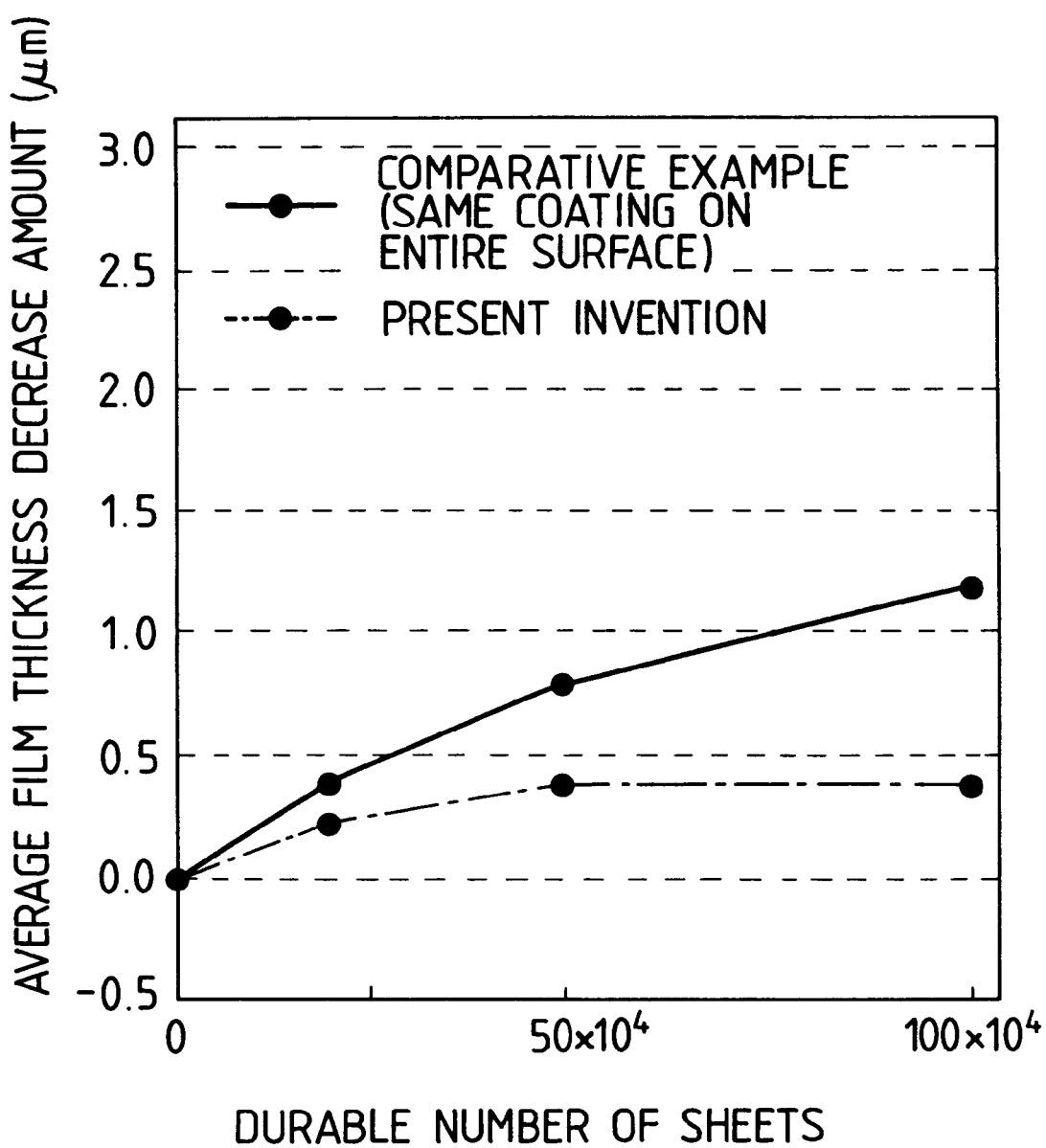

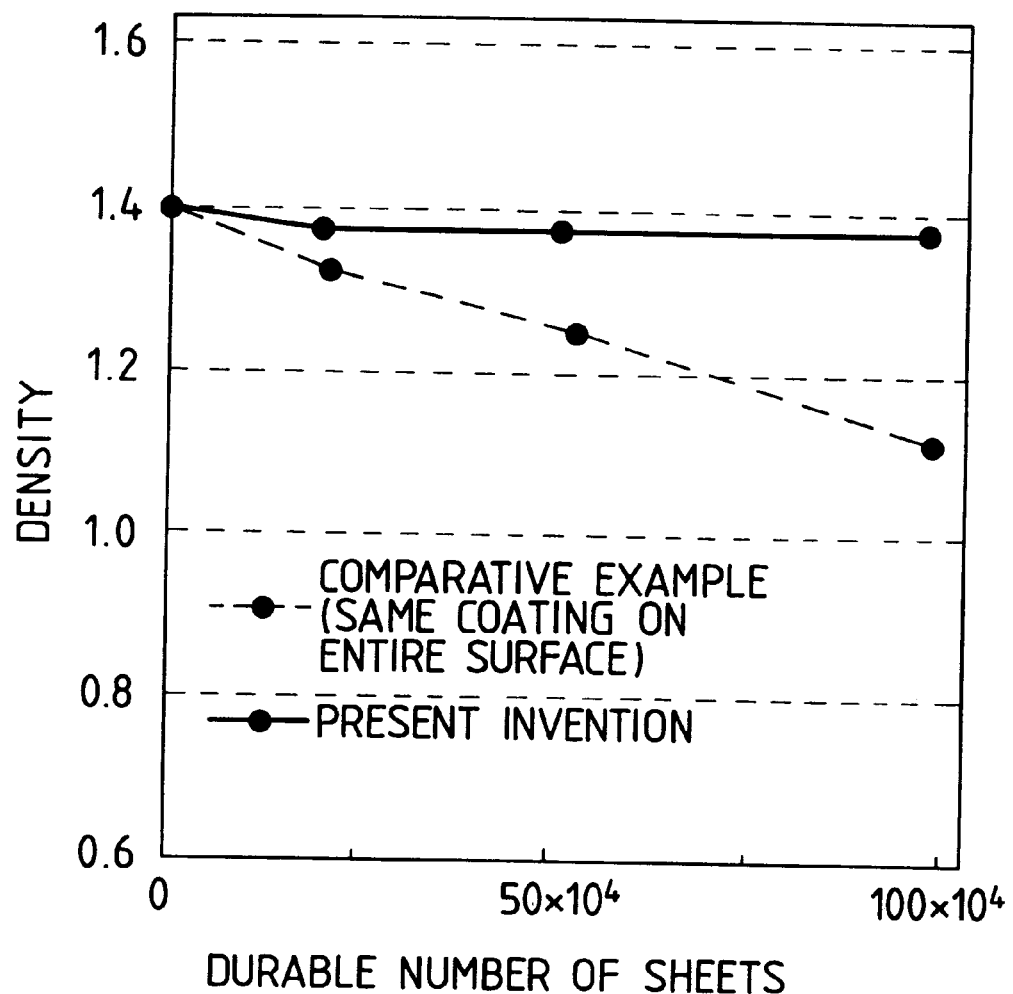

METHOD OF MANUFACTURING A DEVELOPING AGENT BEARING MEMBER

BACKGROUND OF THE INVENTION

1. Field of the Invention

The present invention relates to a developing agent bearing member used in a developing unit of an image forming apparatus of an electrophotographic or electrostatic recording scheme, and a method of manufacturing the developing agent bearing member.

2. Related Background Art

A developing unit for developing and visualizing an electrostatic latent image carried on an electrostatic latent image bearing member is known as a developing unit used for an image forming apparatus such as an electrophotographic copying machine. In a developing unit of this type, a developing agent bearing member (developing sleeve) made of a metal is generally used to carry a developing agent accommodated in a developing vessel onto the developing sleeve and convey it to a developing region opposing the electrostatic latent image bearing member. The electrostatic latent image formed on the electrostatic latent image bearing member is developed with the developing agent to visualize the electrostatic latent image as a developing agent image. As a developing agent, a one-component developing agent containing a magnetic toner, a one-component developing agent containing a nonmagnetic toner, a two-component developing agent containing a nonmagnetic toner and a magnetic carrier are available. The material of the developing sleeve is selected depending on the type of developing agent. When a magnetic developing agent is used, a nonmagnetic metal is used as the material of the developing sleeve. In this case, a magnetic field generating means such as a magnet is arranged inside the developing sleeve. To perform good development, a developing bias is applied to the developing sleeve during development. As the bias, an AC voltage, a DC voltage, or a voltage obtained by superposing AC and DC voltages is used. As a metal for the developing sleeve applied with this voltage, a conductor is often used.

In conveying the developing agent on the developing sleeve to the developing region using the developing unit having the above arrangement, conveyance of the developing agent can be improved by roughening the surface of the developing sleeve, and the surface of the developing sleeve can be coated with a developing agent layer.

As a method of roughening the surface of the developing sleeve, a sandpaper method for abrading the surface of the developing sleeve with sandpaper, a bead-blast method using spherical particles, a sandblast method using particles having indefinite shapes, a combination thereof, a chemical etching method using chemical treatment, or the like is proposed and used in practice.

The entire surface of the developing sleeve may be coated by spraying, dipping, or the like with a resin mixed with a conductive powder.

As disclosed in, e.g., Japanese Laid-Open Patent Application No. 4-212183, a structure in which an insulating region surface is formed on the surface of a developing sleeve, and a conductive region surface is formed thereon is proposed.

The conventional developing sleeves pose the following problems.

The size of the uneven portion on the surface and its distribution state become nonuniform in a metal developing sleeve whose surface is roughened. For this reason, the convey amount of the toner becomes nonuniform, and image defects such as density irregularity and a decrease in density occur, or the resistance value on the surface of the developing sleeve cannot be controlled. It is not only difficult to control the image characteristics such as density irregularity and a decrease in density, but also difficult to optimize the resistance of the surface of the developing sleeve depending on different types of toners, thereby often degrading ghosts.

Roughness control performed by only coating conditions for a developing sleeve whose entire surface is coated with a resin is limited. The surface of the developing sleeve serving as a base must be roughened. This results in an increase in the number of steps and complicated determination of operational conditions. Since the size of the uneven portion of the surface and its distribution state are nonuniform like the developing sleeve whose surface is roughened. Therefore, the convey amount of toner and the charge amount become nonuniform, thereby causing image defects such as density irregularity, a decrease in density, and a ghost.

When the surface of a developing sleeve is simply constituted by a large number of insulating and conductive regions for forming an electric field distribution, the electric field distributions between the individual insulating regions are apparently different from each other depending on the shapes of the insulating regions on the sleeve surface even if the sleeve surface is smooth. It is apparent that when an uneven portion is formed in either or both of the insulating and conductive regions of the sleeve surface, the electric field distributions become different from each other. In particular, when the uneven portion is formed in the conductive region, the electric field concentrates on the projecting portion of the uneven portion, thereby apparently localizing the electric field distribution. Therefore, the charge amounts of the respective toner particles are different from each other to result in large density variations, which may also cause the ghost.

SUMMARY OF THE INVENTION

It is an object of the present invention to provide a developing agent bearing member whose surface has a fine uneven portion, and a method of manufacturing the same.

It is another object of the present invention to provide a developing agent bearing member whose uneven portion is formed by a photo-pattern, and a method of manufacturing the same.

It is still another object of the present invention to provide a developing agent bearing member provided with a resist layer having a photoetching pattern on a base.

The above and other objects, features, and advantages of the present invention will be apparent from the following detailed description of the invention in conjunction with the accompanying drawings.

BRIEF DESCRIPTION OF THE DRAWINGS

FIGS. 8A, 8B, 8C and 8D are views for explaining the steps in manufacturing the developing agent bearing member shown in FIGS. 7A and 7B, in which FIG. 8A is a longitudinal sectional view showing a state in which a resin layer is formed on a base for the developing agent bearing member, FIG. 8B is a longitudinal sectional view showing a state in which the resin layer is exposed, FIG. 8C is a longitudinal sectional view showing the state of the resin layer after exposure, and FIG. 8D is a longitudinal sectional view showing a state after plating;

FIG. 9 is a graph showing the relationship between the durable number of sheets and the film thickness decrease amount in Embodiment 4;

FIGS. 11A, 11B, 11C and 11D are views for explaining the steps in manufacturing the developing agent bearing member in Embodiment 5 in FIG. 10, in which FIG. 11A is a longitudinal sectional view showing a state in which a resin layer is formed on a base for the developing agent bearing member, FIG. 11B is a longitudinal sectional view showing the state of the resin layer after development, FIG. 11C is a plan view of FIG. 11B, and FIG. 11D is a longitudinal sectional view showing a state in which projecting portions are formed by electrodeposition; and FIG. 12 is a graph showing the relationship between the durable number of sheets and the density in Embodiment 5.

DETAILED DESCRIPTION OF THE PREFERRED EMBODIMENTS

The preferred embodiments of the present invention will be described in detail below with reference to the accompanying drawings.

[Embodiment 1]

Figure 1:
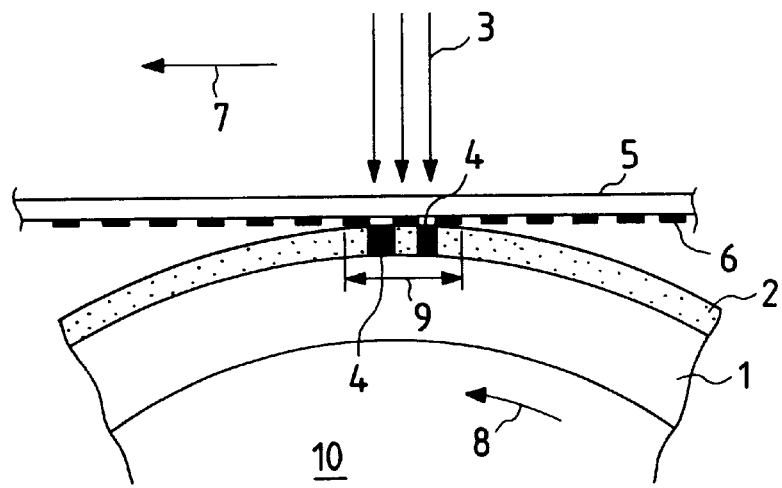
FIG. 1 is a sectional view for explaining a method of exposing a photosensitive resist layer on a developing sleeve in Embodiment 1.
Figure 2:
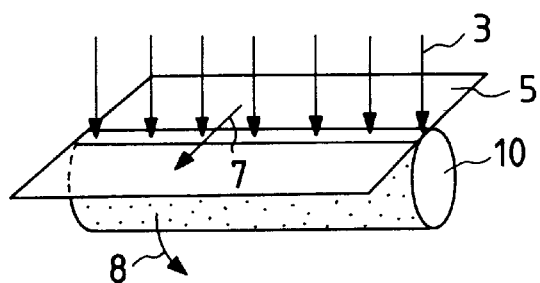
FIG. 2 is a perspective view for explaining the method in FIG. 1.
Figure 3:
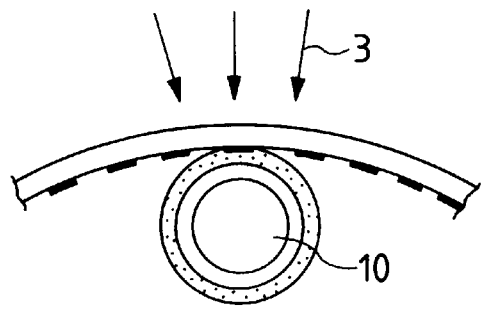
FIG. 3 is a sectional view for explaining an exposure method using a curved plate-like photomask in Embodiment 1.

FIG. 1 is a sectional view for explaining an example of a method of exposing a photosensitive resist layer on a developing sleeve according to the present invention. FIG. 2 is a perspective view for explaining the method in FIG. 1. FIG. 3 is a sectional view for explaining exposure using a curved plate-like photomask.

Referring to FIG. 1, a pattern 6 is formed on a plate-like photomask 5. A photosensitive resin layer 2 formed on a base 1 of a developing sleeve 10 is brought into tight contact with one end portion of the pattern 6.

The photomask is moved in a direction indicated by an arrow 7. During movement of the photomask, parallel light 3 having the photosensitive wavelength band of the photosensitive resist layer is irradiated on the photomask 5 at a width smaller than a contact width 9 and a required length in the longitudinal direction of the developing sleeve 10, thereby starting exposure. The developing sleeve 10 in tight contact with the pattern surface rotates in a direction indicated by an arrow 8 with movement of the photomask 5. When the developing sleeve 10 rotates by one revolution, exposure of the entire surface of the developing sleeve 10 is completed. An exposure amount is adjusted by an illuminance, a rotation speed, and the like. A photosensitive reaction portion 4 is formed in the resist layer 2 upon exposure.

The photosensitive resist layer is developed with an appropriate developing solution to obtain a desired pattern.

The moving direction of the photomask 5 may be a direction reverse to the direction indicated by the arrow 7.

The developing sleeve may be rotated and moved in place of the movement of the photomask. In this case, exposure light must be irradiated in the same rotational direction of the developing sleeve at the same moving speed of the axis of the developing sleeve relative to the photomask.

FIG. 3 shows a case using a curved plate-like photomask. The process is the same as shown in FIGS. 1 and 2. Using the curved photomask, the contact width between the developing sleeve and the photomask pattern can increase. For this reason, the exposure width can increase to shorten the exposure time. At this time, exposure parallel light 3 is vertically irradiated on the contact surface.

[Embodiment 2]

Figure 4:
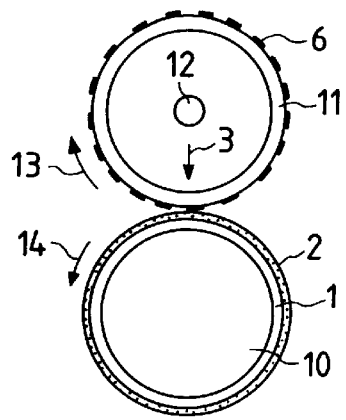
FIG. 4 is a sectional view for explaining a method of exposing a photosensitive resist layer on a developing sleeve in Embodiment 2.
Figure 5:
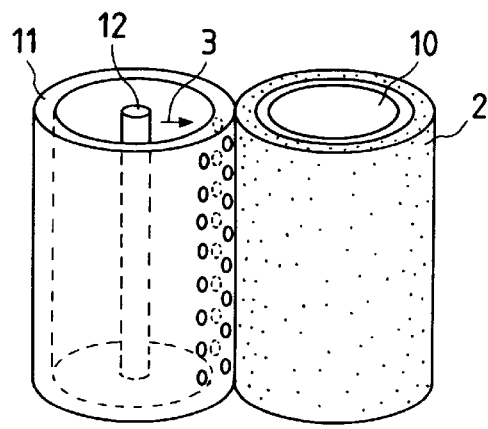
FIG. 5 is a perspective view for explaining the method in FIG. 4.

FIG. 4 is a sectional view for explaining an example of a method of exposing a photosensitive resist layer on a developing sleeve according to the present invention. FIG. 5 is a perspective view for explaining the method in FIG. 4.

Referring to FIG. 4, a pattern 6 is formed on the outer circumferential surface of a cylindrical photomask 11. A photosensitive resist layer 2 formed on a base 1 of a developing sleeve 10 is brought into tight contact with the pattern 6.

The photomask 11 is rotated in a direction indicated by an arrow 13 or the developing sleeve 10 is rotated in a direction indicated by an arrow 14 while the photomask 11 is kept in tight contact with the developing sleeve 10. During rotation, parallel light 3 having the photosensitive wavelength band of the photosensitive resist layer is irradiated at a width smaller than the contact width and a required length in the longitudinal direction of the developing sleeve, thereby starting exposure. When the photomask 11 or the developing sleeve 10 rotates by one revolution, exposure of the entire surface of the developing sleeve is completed. An exposure amount is adjusted by an illuminance, a rotation speed, and the like.

The photosensitive resist layer is developed with an appropriate developing solution to obtain a desired pattern.

The rotational direction of the photomask or developing sleeve may be a direction reverse to the above direction.

[Embodiment 3]

Figure 6:
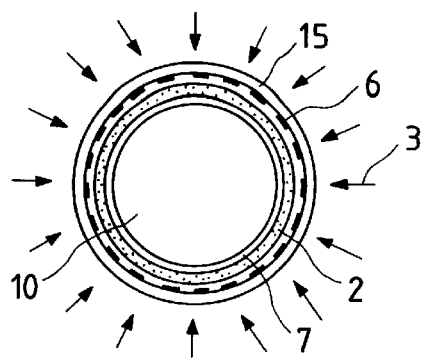
FIG. 6 is a sectional view for explaining a method of exposing a photosensitive resist layer on a developing sleeve in Embodiment 3.

FIG. 6 is a sectional view for explaining a method of exposing a photosensitive resist layer on a developing sleeve according to the present invention.

A pattern 6 is formed on the inner circumferential surface of a cylindrical photomask 15. The inner diameter of the cylindrical photomask 15 is slightly larger than an outer diameter including a photosensitive resist layer 2 formed on a base 7 of a developing sleeve 10 and allows smooth insertion/removal of the developing sleeve into/from the cylindrical photomask.

The photomask and the developing sleeve are fixed so as not to change the positional relationship between them, and exposure light 3 is vertically irradiated on the pattern 6 and the contact surface.

The photosensitive resist layer is developed with an appropriate developing solution to obtain a desired pattern.

The exposure method may use an i- or g-ray, an x-ray, or a laser beam which has a photosensitive wavelength band.

[Embodiment 4]

FIGS. 7A to 8D show Embodiment 4 of the present invention.

Figure 7A:
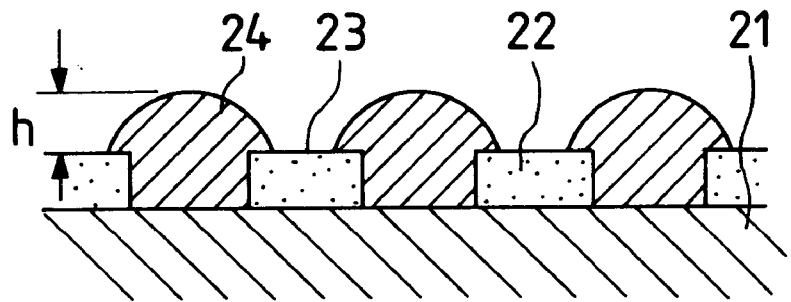
FIG. 7A is a partially enlarged longitudinal sectional view of the surface layer of a developing agent bearing member in Embodiment 4.
Figure 7B:
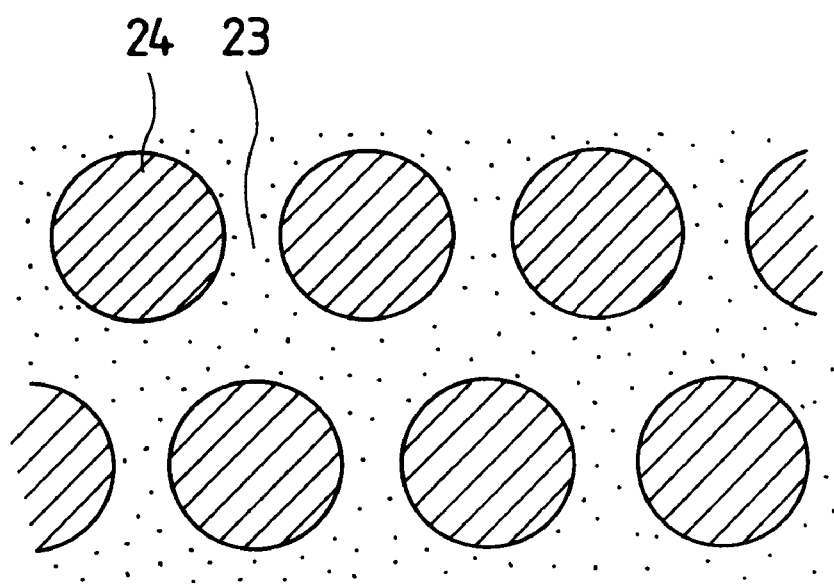
FIG. 7B is a partially enlarged plan view thereof.

FIG. 7A is a partial enlarged longitudinal sectional view of the surface of a developing agent bearing member according to the present invention, FIG. 7B is a plan view of the developing agent bearing member, and FIGS. 8A to 8D are sectional views showing the steps in forming a surface layer shown in FIGS. 7A and 7B.

FIGS. 7A and 7B show the surface structure of the developing agent bearing member of a developing unit according to Embodiment 4 of the present invention.

The surface structure of this developing agent bearing member comprises a base 21 made of a metal (e.g., aluminum) and constituting the developing agent bearing member, a recessed portion 23 which is formed by the surface of a resin layer 22 of a photosensitive resist (photosensitive resin) as the first material on the surface of the base 21 upon regularly removing predetermined island portions of the photosensitive resin by photoetching to form island spaces, and projecting portions 24 obtained by plating the island spaces of the resin layer 22 with a metal such as nickel as the second material at a level higher than the surface of the resin layer 22.

The uneven portion of the developing agent bearing member is formed as follows. After the regular spaces are formed in the resin layer 22 by photoetching, these spaces are plated with a metal to form the projecting portions 24, thereby defining the surface of the resin layer 22 as the recessed portion 23. In this manner, the regular, fine projecting portions 24 and the recessed portion 23 can be formed on the surface of the developing agent bearing member. The term "regular" indicates that all the projecting portions 24 have the same size and a uniform distribution state.

Since the uneven portion (the recessed portion 23 and the projecting portions 24) is formed on the surface of the developing agent bearing member, the frictional force between the developing agent bearing member and the developing agent increases to prevent slippage, thereby stabilizing the convey force. The uneven portion of the surface of the developing agent bearing member applies periodic micro vibrations to the developing agent reservoir on the upstream side of a blade for regulating the developing agent layer on the outer circumferential surface of the developing agent bearing member. The micro vibrations can take a developing agent mass apart into pieces to allow formation of a uniform developing agent layer.

Since the projecting portions 24 and the recessed portion 23 are regularly formed on the surface of the developing agent bearing member, the convey amount of the developing agent and the frictional charge amount applied to the developing agent become uniform. Therefore, density irregularity and the decrease in density can be prevented.

The materials of the projecting portions 24 and the recessed portion 23 are different and have different volume resistivities. The volume resistivities of the projecting portions 24 and the recessed portion 23 are as follows. In this example, the volume resistivity of the projecting portions 24 made of nickel is $10^{-6}$ $\Omega \cdot cm$, while that of the recessed portion 23 made of a resin is $10^5$ $\Omega \cdot cm$ or more. Therefore, the area ratio of the projecting portions 24 and the recessed portion 23 is changed to allow control of the resistance value of the whole developing agent bearing member.

The change in area ratio of the projecting portions 24 and the recessed portion 23 also allows control of the convey amount of the developing agent.

A height difference between the projecting portions 24 and the recessed portion 23 preferably falls within the range $(0.05 \times r) \leq h \leq (50 \times r)$ where r is the average particle size of the developed agent to be used. If $(0.05 \times r) > h$, the surface of the developing agent bearing member becomes relatively smooth. For this reason, a shortage occurs in the frictional charge amount applied to the developing agent, or variations occur. If, however, $h > (50 \times r)$, then a large amount of charges of the developing agent escape through the projecting portions 24 made of the metal. A charge amount is reduced, and the density of image quality lowers.

If the range is $(0.05 \times r) \leq h \leq (50 \times r)$, a uniform frictional charge amount having a predetermined value or more can be assured.

In particular, in this embodiment, the developing agent is the one-component magnetic toner developing agent, and its average particle size r is 6 μm. A preferable range to meet the particle size of the developing agent is set as follows:

$$(0.1 \times r) \leq h \leq (5 \times r)$$

that is, in this embodiment, the height difference h is set close to the developing agent particle size r due to the following reason.

A charged residual developing agent is left in the recessed portion 23 of the developing agent bearing member. This residual developing agent should be replaced with another developing agent. When the height difference h is set close to the developing agent particle size r, the charged residual developing agent in the recessed portion 23 can be reduced. In addition, a developing agent to replace the charged residual developing agent in the recessed portion 23 can be easily controlled. Fine tribo-control can be performed.

As described above, nickel as the material of the projecting portions 24 has a volume resistivity lower than that of the resin forming the recessed portion 3, but higher than aluminum forming the base 21 of the developing agent bearing member. Therefore, in overcharging the developing agent, the charges tend to escape to the base 21 through the projecting portions 24, and a ghost caused by charge-up tends not to occur.

The projecting portions 24 are formed in a doom-like shape. This allows a decrease in abrasion amount and an improvement in durability.

The steps in manufacturing the uneven structure on the surface of the developing agent bearing member will be described with reference to FIGS. 8A to 8D.

Figure 8A:
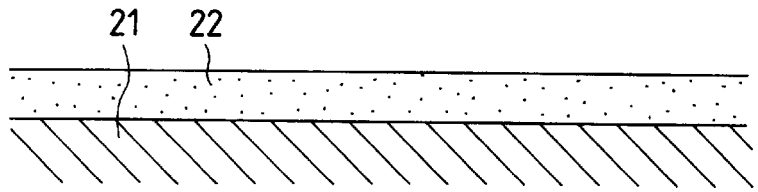

As shown in FIG. 8A, the resin layer 22 is formed by a coating process of electrodeposition coating on the metal base 21 of the developing agent bearing member having undergone degreasing treatment.

Electrodeposition coating is a method of depositing, by electrophoresis, a powder dispersed together with a resin in an electrodeposition paint. In this embodiment, as a photosensitive electrodeposition resist (photosensitive electrodeposition resin), a positive resist whose irradiated portion can be easily dissolved is used. This photosensitive electrodeposition resist corresponds to the second material for forming the recessed portion 23.

Figure 8B:
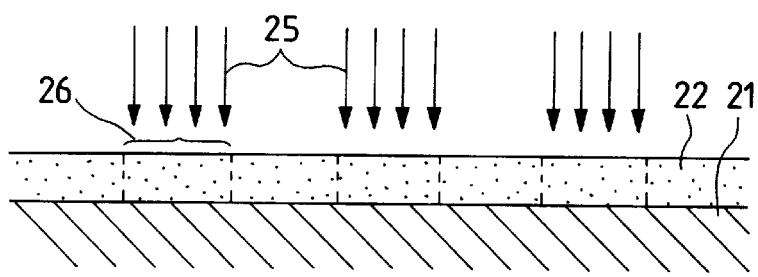

As shown in FIG. 8B, a desired pattern is exposed on a resin layer 22 with light 25 having the photosensitive wavelength band of the resin layer 22. The exposure pattern in this embodiment has complete rounds having the same size in a uniform distribution. A light reaction portion 26 in the resin layer 22 has a columnar shape (island shape). The exposure method can use an i-ray (infrared ray), a γ-ray, an x-ray, or a laser beam having the photosensitive wavelength band.

Figure 8C:
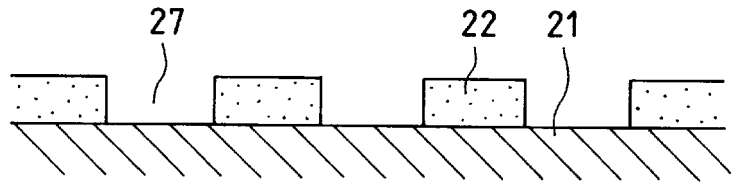

Since the photosensitive electrodeposition resist is of a positive type, the island light reaction portion 26 is dissolved by development, and a non-exposed insoluble portion is left, as shown in FIG. 8C. That is, island spaces 27 having the same size are uniformly distributed in the resin layer 22.

Figure 8D:
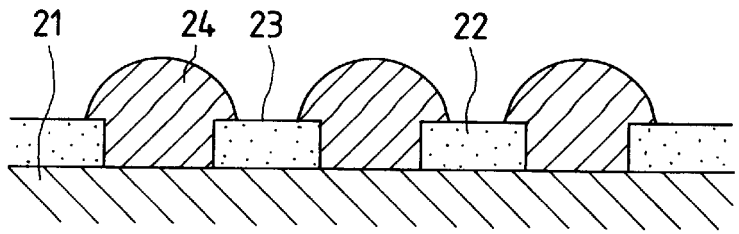

The island spaces 27 are plated with a metal to form the projecting portions 24 as metal plating portions having a level higher than the surface of the resin layer 22, as shown in FIG. 8D.

More specifically, the projecting portions 24 are made of a metal as the first material. The recessed portion 23 is made of the photosensitive electrodeposition resist as the second material. The projecting portions 24 and the recessed portion 23 are formed in contact with the metal base 21 of the developing agent bearing member.

In this embodiment, an alkali degreasing agent (available from Henkel Hakusui-sha) was used to degrease the surface of the developing agent bearing member. An aluminum A6063 was used to form the base of the developing agent bearing member. A positive type "Photo ED P-1000" available from NIPPON PAINT CO., LTD. was used as the photosensitive electrodeposition resist. Nickel plating was performed to form the projecting portions 24.

The convey force for the developing agent can be stabilized in the developing unit having the above structure.

The uneven portion (this portion is constituted by the recessed portion 23 and the projecting portions 24) of the surface of the developing agent bearing member is formed as follows. After the regular spaces 27 are formed in the resin layer 22 by photoetching, the spaces 27 are plated with a metal to form the projecting portions 24, thereby defining the surface of the resin layer 22 as the recessed portion 23. The regular projecting portions, i.e., all the projecting portions 24 having the same size and the uniform distribution are formed on the surface of the developing agent bearing member. As a result, the convey amount of the developing agent and the frictional charge amount applied to the developing agent become uniform, and density irregularity and the decrease in density can be prevented.

By changing the projecting height h of the projecting portions 24, and the area ratio of the projecting portions 24 and the recessed portion 23 to the entire surface of the developing agent bearing member, the convey amount of the developing agent, and the volume resistance on the entire surface of the developing agent bearing member can be controlled.

The durability test using the developing agent bearing member of this embodiment is shown in FIG. 9.

In this test, a developing agent bearing member has the surface which was uniformly coated with a single resin was used as a comparative example. The durable number of sheets is plotted along the abscissa, and the average film thickness decrease amount is plotted along the ordinate. In this embodiment, as compared with the comparative example, a decrease in average film thickness decrease amount is small with an increase in the durable number of sheets. That is, this embodiment has a higher resistance to wear than that of the comparative example.

This is because this embodiment has a high resistance to wear because the projecting portions 24 are made of a metal, whereas the uneven portion of the resin film made of the same resin in the comparative example wears greatly.

In addition to this test, the present inventor confirmed that the image characteristics were improved when a reuse developing agent obtained by mixing a developing agent having a small average particle size and a wasted developing agent in a new developing agent was used. It is assumed that the developing agent even having the small particle size can be conveyed in a sufficient amount by the uneven portion of the surface of the developing agent bearing member.

[Embodiment 5]

Embodiment 5 of the present invention will be described with reference to FIGS. 10 and 11A to 11D.

Figure 10:
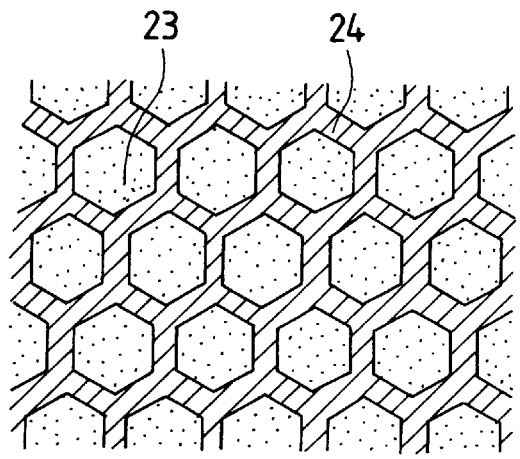
FIG. 10 is a partial enlarged plan view of the surface layer of a developing agent bearing member in Embodiment 5.

FIG. 10 is a partial enlarged plan view of the surface of a developing agent bearing member according to the present invention, and FIGS. 11A to 11D are sectional views showing the steps in forming the surface structure shown in FIG. 3.

FIG. 10 shows the surface structure of the developing agent bearing member of a developing unit of Embodiment 5 of the present invention.

The surface structure of this developing agent bearing member comprises polygonal recessed portions 23 (hexagons in this embodiment) made of a resin layer 22. A projecting portion 24 forms the boundary lines between the polygonal recessed portions 23 and continues on the entire surface of the developing agent bearing member.

When the recessed portions 23 (or projecting portion) have a polygonal shape, the resistance value of the entire surface of the developing agent bearing member can be finely adjusted. The resistance value of the entire surface has an importance in that it influences a developing bias voltage to be applied during development.

When the polygonal recessed portions 23 in this embodiment are formed close to each other, the projecting portions 24 as the boundary lines can be kept continuous although they are very thin. The width of the projecting portion 24 can be minimized. This is also true when the projecting portions are formed into polygonal projecting portions and the recessed portion serves as a boundary line.

To the contrary, when the projecting portions 24 are island portions (columnar portions) as in Embodiment 4 shown in FIGS. 7A and 7B, the interval between the projecting portions 24 cannot be decreased any longer when the continuous recessed portion 23 is disconnected to form isolated recessed portions. In addition, the area of each independent recessed portion 23 cannot be reduced any longer.

The steps in forming the surface structure shown in FIG. 10 will be described with reference to FIGS. 11A to 11D below.

Figure 11A:
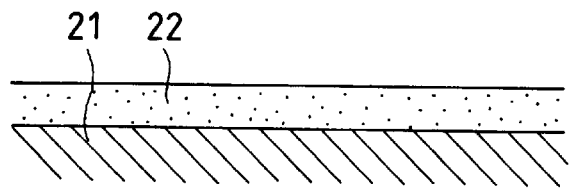

As shown in FIG. 11A, the resin layer 22 is formed by a process of electrodeposition coating on a metal base 21 of the developing agent bearing member having undergone degreasing treatment.

In this embodiment, as a photosensitive electrodeposition resist (photosensitive electrodeposition resin) forming the resin layer 22, a negative type resist whose irradiated portion becomes insoluble is used. This photosensitive electrodeposition resist corresponds to the second material for forming the recessed portions 23.

A desired pattern is exposed on the resin layer 22. The exposure pattern in this embodiment has regular hexagons having the same size in a uniform distribution.

Figure 11B:
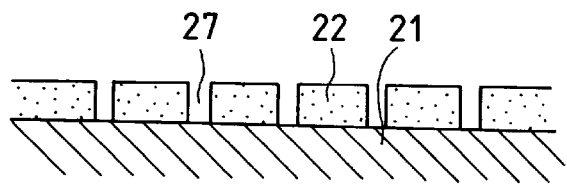
Figure 11C:
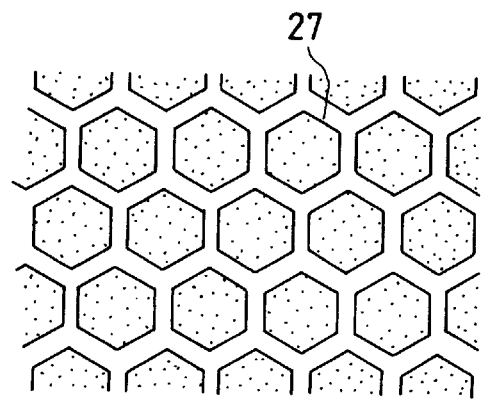

Since the photosensitive electrodeposition resist is of a negative type, the non-exposed boundary line portion is dissolved by development, and the exposed regular hexagonal insoluble portions are left, as shown in FIGS. 11B and 11C. That is, a space 27 as the boundary line is formed in the resin layer 22.

An electrodeposition film is deposited on the metal base 21 exposed in the space of the boundary line of the resin layer 22 to form the projecting portion 24 having a level higher than the surface of the resin layer 22, as shown in FIG. 1D. This electrodeposition paint is mixed with a conducive filler, so that the projecting portion 24 becomes conductive.

A SUS304 was used as the base 1 of the developing agent bearing member. A photo ED resist negative type "Photo ED N-100" available from NIPPON PAINT CO., LTD. was used as the photosensitive electrodeposition resist for forming the resin layer 22. The electrodeposition paint as the material for the projecting portion 24 was obtained by mixing 3 phr of carbon black and 40 phr of titanium oxide as conductive fillers in a cation type electrodeposition paint (tradename: New Peiton ER-F2 available from Kamimura Kogyo K.K.)

The volume resistivities of the projecting portion 24 and the recessed portions 23 in this embodiment are determined as follows. The projecting portion 24 containing the conductive fillers has a volume resistivity of $10^{-2}$ to $10^{-3}$ $\Omega \cdot cm$, and the recessed portions 23 made of a resin have a volume resistivity of $10^5$ $\Omega \cdot cm$ or more.

The volume resistivity of the projecting portion 24 is lower than that of the recessed portions 23 and higher than that of stainless steel constituting the base 21. In overcharging the developing agent, the charges of the developing agent tend to escape to the base 21 through the projecting portion 24. Therefore, a ghost caused by the charge-up can be suppressed.

A projecting height h of the projecting portion 24, the area ratio of the projecting portion 24 or the recessed portions 23 to the entire surface of the developing agent bearing member, and the mixing ratio of the conductive fillers are changed to allow control of the convey amount of the developing agent and the volume resistivity of the entire surface.

In this embodiment, only the electrodeposition resist was used as the material of the resin layer 22. However, the material of the resin layer 22 is not limited to this. A conductive filler may be mixed in the electrodeposition resist to adjust the volume resistivity of the resin layer 22, i.e., the recessed portions 23. Note that the conductive filler must be mixed within the range in which the electrodeposition paint does not attach to the projecting portion 24 in electrodepositing the projecting portion 24.

The durability test result using the developing agent bearing member of this embodiment is shown in FIG. 12. In this test, a developing agent bearing member whose entire surface had the same coating was used as a comparative example. The durable number of sheets is plotted along the abscissa, and the density is plotted along the ordinate. In the comparative example, the density lowers with an increase in the durable number of sheets. To the contrary, in this embodiment, the density does not lower even with an increase in the durable number of sheets.

In the comparative example, the uneven portion of the resin film made of the same resin greatly wears, and the conveying capability for the developing agent is impaired. Based on these reasons, it is assumed that the density is reduced. However, in this embodiment, since the projecting portion 4 contains the metal fillers, the resistant to wear is excellent, and no decrease in convey amount of the developing agent occurs, so that it is assumed that no decrease in density occurs.

The present invention is not limited to the above embodiments. Various changes and modifications may be made within the spirit and scope of the invention.

For embodiment, in the above embodiment, electrodeposition coating is applied to the resin layer using an electrodeposition resist. However, a general resist having no electrodeposition properties may be used and applied by coating such as dipping or spin coating in which the resist solution is dropped on the rotating base to spread the solution by the centrifugal force.

The electrodeposition resin serving as the material of the resin layer may be of a cation (positive ion) or anion (negative ion) type.

By properly selecting the factors such as the electrolytic conditions in forming a coating film by electrodeposition coating, heating and setting conditions, the content of a filler, fluidity of the resin, the shape of the electrodeposition coating films constituting the recessed and projecting portions 23 and 24, and hence the resistance value of the entire surface of the developing agent bearing member may be controlled.

A material and a filler which are mixed to obtain a conductive resin may be of a metal, a conductive powder (e.g., carbon black, graphite, or conductive ceramic), a semiconductive powder, and an electrolytically polymerizable conductive molecule (e.g., pyrrole or thiophene).

Plating for forming the projecting portion is not limited to nickel plating. A material free from oxidation and corrosion and excellent in resistance to wear, such as a plating of an alloy mainly composed of gold or the like may be used.

To remove the resin layer, photoetching is used in the above embodiments. The present invention is not limited to this. A resin layer may be directly removed with, e.g., a laser beam. In this case, the resin can be directly removed with the laser beam within a short period of time.

In the above embodiments, a one-component magnetic developing agent is used. However, the type of developing agent is not limited to the specific one.

Various changes and modifications may be made within the technical scope of the present invention.

What is claimed is:

1. A method of manufacturing a developing agent bearing member, comprising the steps of:
   preparing a base;
   forming a photosensitive resist layer on said base;
   close contacting a portion of the photosensitive resist layer with a photomask;
   pattern exposing the close contacting portion while moving the photosensitive resist layer and the photomask to close contact photosensitive resist layer portions and the photomask in sequence; and
   forming an uneven portion on a surface of the developing agent bearing member by etching the pattern-exposed photosensitive resist layer.

2. A method according to claim 1, wherein said base is cylindrical.

3. A method according to claim 2, wherein said photomask has a plate shape.

4. A method according to claim 2, wherein said photomask has a cylindrical member having a larger radius of curvature than that of said base.

5. A method according to claim 1, further comprising the step of filling a conductive material in a recessed portion formed by etching, the conductive material having a level higher than a surface of the resist layer.

6. A method according to claim 5, wherein the step of filling the conductive material comprises filling a metal by plating.

7. A method according to claim 5, wherein the step of filling the conductive material comprises filling a conductive material by electrodeposition.

8. A method of manufacturing a developing agent bearing member, comprising the steps of:

preparing a base;

forming a resin layer on said base;

partially removing the resin layer to form a recessed portion; and filling a conductive material in the recessed portion from which resin is removed, thereby forming a projecting portion.

9. A method according to claim 8, wherein the step of filling the conductive material comprises filling a metal by plating.

10. A method according to claim 8, wherein the step of filling the conductive material comprises filling a conductive material by electrodeposition.

11. A method of manufacturing a developing agent bearing member, comprising the steps of:

preparing a cylindrical base;

forming a photo sensitive resist layer on said cylindrical base;

preparing a cylindrical photomask, wherein an internal diameter of the photomask is larger than an external diameter of the cylindrical base;

close contacting an inner cylindrical surface of the photomask with an outer cylindrical surface of the cylindrical base;

pattern exposing the close contacting surfaces; and forming an uneven portion on a surface of the developing agent bearing member by etching the pattern-exposed photosensitive resist layer.

\* \* \* \* \*

UNITED STATES PATENT AND TRADEMARK OFFICE
CERTIFICATE OF CORRECTION

PATENT NO. : 5,965,329

DATED : October 12 1999

INVENTOR(S) : TAKASHI SAKAKI, ET AL.

Figure 11D:
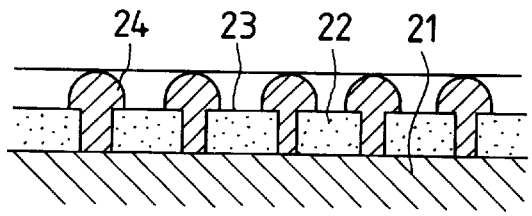

It is certified that error appears in the above-identified patent and that said Letters Patent is hereby corrected as shown below:

<u>COLUMN 9</u>:

Line 11, "FIG. 1D." should read --FIG. 11D.--.

Signed and Sealed this

Twenty-seventh Day of June, 2000

Attest:

Q. TODD DICKINSON

*Attesting Officer*     *Director of Patents and Trademarks*